United States Patent [19]
Person et al.

[11] Patent Number: 5,235,311
[45] Date of Patent: Aug. 10, 1993

[54] MAGNETIC VARIABLE RESISTOR

[75] Inventors: Herman R. Person; Thomas L. Veik, both of Columbus, Nebr.

[73] Assignee: Dale Electronics, Inc., Columbus, Nebr.

[21] Appl. No.: 884,207

[22] Filed: May 18, 1992

[51] Int. Cl.⁵ .............................................. H01L 43/00
[52] U.S. Cl. ..................... 338/32 R; 338/62; 338/211; 338/218; 338/278; 338/282
[58] Field of Search ............... 338/32 R, 62–211, 338/217–218, 278, 282–296, 297; 336/61, 192; 323/353

[56] References Cited

U.S. PATENT DOCUMENTS 3,480,832  11/1969  Person .
3,581,264   5/1971  Person .

Primary Examiner—Marvin M. Lateef
Attorney, Agent, or Firm—Zarley, McKee, Thomte, Voorhees, & Sease

[57] ABSTRACT

A magnetic variable resistor has an elongated band of electrically resistive magnetic material, with the side edges tapered to a sharp point so that the skin effect causes current to migrate to the edges to create greater resistance. A layer of insulating material can cover the band as it is coiled. Leads are secured to opposite ends of the band. An alternate form of the invention embeds the coiled band in a magnetic insulating material. Surface mount leads are flush with at least one surface of the insulating material.

9 Claims, 2 Drawing Sheets

MAGNETIC VARIABLE RESISTOR

BACKGROUND OF THE INVENTION

This invention relates to a device that protects electronic circuits from damage caused by fast rising voltage transients. The use of electronic devices of all kinds is ever increasing. These devices are often required to share a power source with power hungry machinery. This machinery can and often does inflict large voltage transients onto the power lines. Another source of voltage transients is lightening. These voltage transients can be damaging to any electronic equipment that is not protected against such transients.

Various circuits and devices can be used to provide some protection against damaging voltage transients. These include filtering circuits using inductors and capacitors, varistors, spark gaps, and ferrite beads.

Filtering circuits using inductors and capacitors can absorb the energy contained in a transient, but they have the disadvantage that energy will subsequently be returned to the circuit. Varistors are widely used to protect against voltage transients. However, they have the disadvantage that they fail after absorbing a few transients. There is no way to detect their failure short of removing the varistor and testing it.

Spark gaps will dissipate some of the energy contained in a transient. However, they will not limit the voltage rise to a level that is safe for most electronic circuits. They also cannot react quickly enough to provide protection. Ferrite beads can be used. However, they operate at very high frequencies and can only protect against transients of very short duration.

U.S. Pat. No. 3,480,832 discloses a magnetic variable resistor as a component in an electrical surge arrester. U.S. Pat. No. 3,581,264 focuses more specifically on a magnetic variable resistor. These devices fulfill their claimed objectives. However, their skin effect and the resulting increase in resistance are often less than desirable.

It is therefore a principal object of this invention to provide a magnetic variable resistor that can be easily placed in series with a conductor carrying current to a load, and which will present very little resistance to D.C. currents and low frequency currents, but which will increase substantially in resistance as the rate of change of current increases.

It is a further object of this invention to provide a magnetic variable resistor that will absorb the energy contained in a high voltage transient and dissipate that energy as heat.

A still further object of the invention is to provide a magnetic variable resistor that is capable of operating at frequencies of 10 MHZ or more.

These and other objects will be apparent to those skilled in the art.

SUMMARY OF THE INVENTION

The magnetic variable resistor of this invention comprises an elongated band of electrically resistive material having opposite ends and opposite planar surfaces. A first form of the invention has an insulative sheet secured to and coextensive with one of the planar surfaces. Electrical leads are secured to opposite ends of the band and extend outwardly therefrom away from the longitudinal axis of the band. The band and the insulative sheet are rolled into a helical coil, and the leads extend longitudinally from the coil. The edges of the band are tapered or feathered.

A modified form of the invention encapsulates the helical coil in a body of magnetic insulative material. In that case, the insulative sheet is not used, and the insulative material separates the spaced spiral segments of the band within the insulative material.

In either form of the invention, the leads can extend either in the same direction or opposite directions from the helical coil. When the helical coil is embedded in the insulative material, the leads protrude outwardly through the insulative material.

DESCRIPTION OF THE INVENTION

Figure 1:
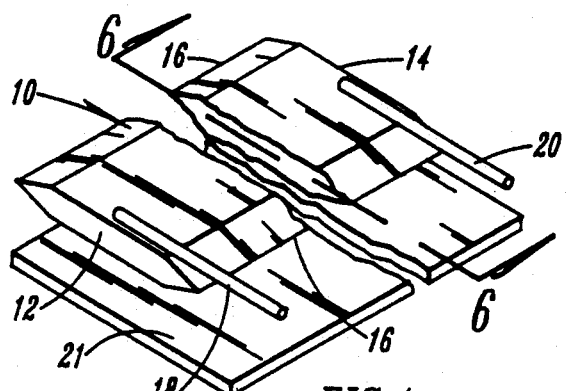
FIG. 1 is a partial exploded perspective view of the principal components of one form of the invention.
Figure 2:
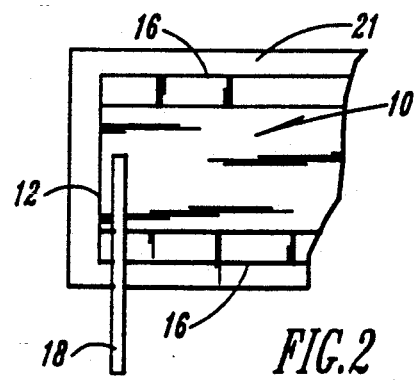
FIG. 2 is a partial plan view of the assembled components shown in FIG. 1.
Figure 6:
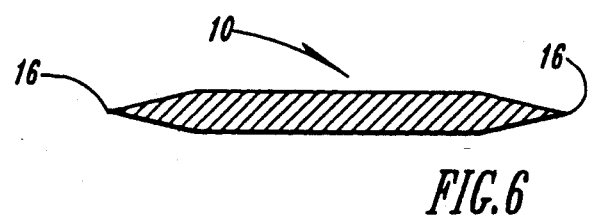
FIG. 6 is an enlarged scale sectional view taken on line 6—6 of FIG. 1 showing the cross sectional shape of the resistive band.

With reference to FIGS. 1 and 2, a band 10 of magnetic resistance resistive material has ends 12 and 14, and tapered side edges 16 (see FIG. 6). Wire leads 18 are soldered or otherwise secured to band 10 adjacent the ends 12 and 14 and extend outwardly at right angles from the band 10. An insulative layer 21 is superimposed over one surface of the band.

As indicated, the material of band 10 is preferably a magnetic material. It is desirable that this material have a magnetic permeability that is quite large. One such material is Permalloy 80 which can be obtained from Spang Specialty Metals. The dimensions of this material can vary considerably. The preferred embodiment of the invention employs a band 10 whose length is 36 inches and whose width is 1 inch and whose thickness is eight thousandths of an inch.

Leads 18 and 20 are comprised of wire and have a length appropriate for use through hole printed circuit board soldering. As will be discussed hereafter, surface mounting techniques can also be used.

Insulation layer 21 is an insulating material such as paper or kapton. It is desirable to use and insulate with minimum thickness as the skin effect is enhanced as insulation thickness is decreased. The width of layer 21 must be wider than band 10 to prevent shorting of the turns of the band as it is barreled into a helical configuration.

Leads 18 and 20 are attached to band 10 by welding, soldering or other means. If soldering is used, the solder must be a high temperature material. High temperature solder will not melt when the finished product is soldered into a printed circuit board.

Figure 3:
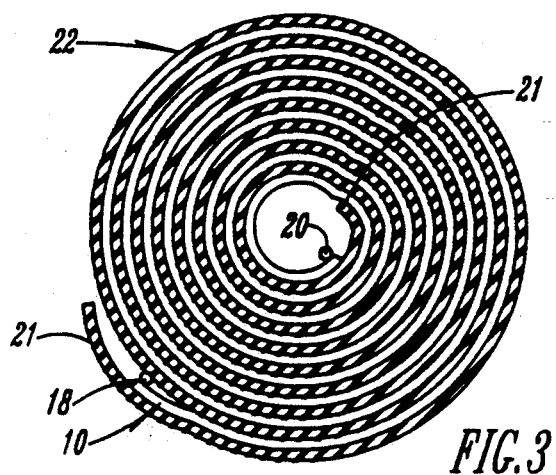
FIG. 3 is an enlarged scale end view when the components of FIG. 2 are rolled into a helical coil.
Figure 4:
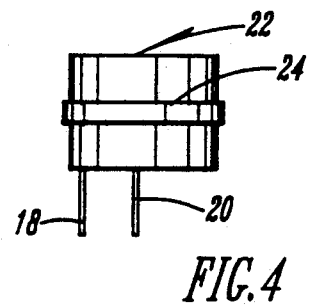
FIG. 4 is a small scale elevational view of the assembled helical coil of FIG. 3.

The band of FIGS. 1 and 2 is wound into a helical coil 22 (FIG. 3) and is secured in this configuration by a suitable band 24 (FIG. 4).

Figure 5:
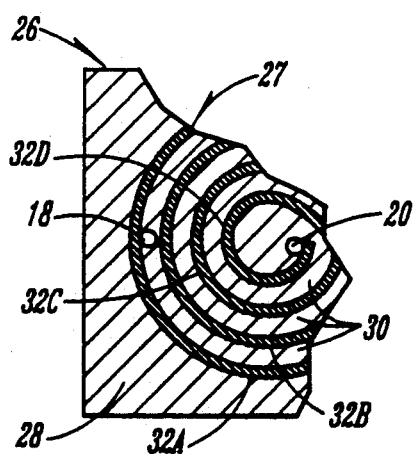
FIG. 5 is a partial sectional view through an alternate form of the invention and depicts the helical coil similar to that of FIG. 3 embedded in a body of magnetic insulative material.

An alternate form of the invention is shown in FIG. 5 which shows a magnetic resistor 26 comprised of a helical coil 27 consisting of the band of resistive material of FIGS. 1—3, but without the layer of insulative material 21. The helical coil 27 is embedded in magnetic insulative material 28. As shown in FIG. 5, spaces 30 exist between spiral segments 32A, 32B, 32C and 32D to insulate the spiral segments from each other.

The magnetic insulative material 28 is preferably a ferromagnetic material which typically could be of carbonyl iron powder or ferrite particles mixed with an organic binder. The ferromagnetic material will enhance the skin effect of the band 10.

Figure 7:
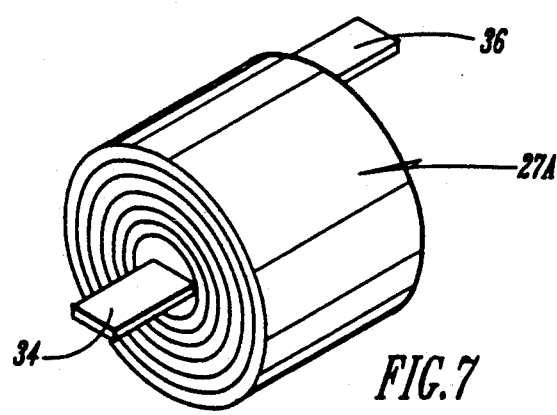
FIG. 7 is an enlarged scale perspective view of an alternate helical coil to be embedded in insulative material.
Figure 8:
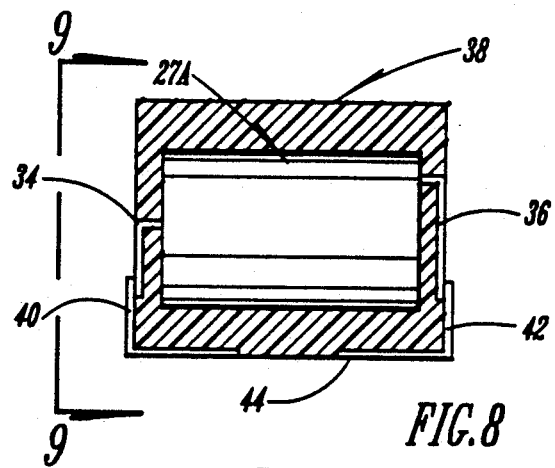
FIG. 8 is a cross sectional view of the device of FIG. 7 when embedded and assembled with surface mounting lead.
Figure 9:
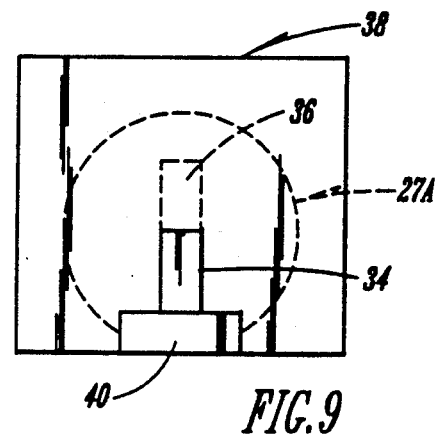
FIG. 9 is an elevational view of the device of FIG. 8 taken on line 9—9 of FIG. 8.

With reference to FIG. 6, the side edges 16 of band 10 terminate in tapered or feathered edges. These sharp end points of edges 16 reduce the cross sectional area at the edges of the conductor. Thus, when skin effect forces current to the edges 16, a greater increase in resistance will be realized. The helical coil 27A in FIG. 7 is identical to the helical coil 27 (FIG. 5) before it is embedded, as shown in FIG. 5. Helical coil 27A differs from coil 27 in that bent tab leads 34 and 36 are used with coil 27A instead of the wire leads 18 and 20 which are used with coil 27. FIGS. 8 and 9 show the coil 27A encapsulated in an insulative body 38 comprised of the same material as the insulative material 28. L-shaped surface mounted lead 40 is welded or secured to the bent tab 34. (FIGS. 8 and 9) Similarly, an L-shaped surface mounted lead 42 is welded or otherwise secured to the bent tab 36. Surface mount leads 40 and 42 are flush with the bottom 34 of body 38 so as to be able to achieve electrical contact with an appropriate mounting surface.

Figure 10:
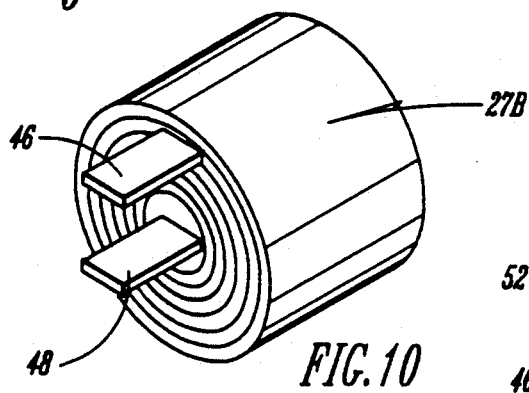
FIG. 10 is a view similar to that of FIG. 7 but shows an alternate form of leads.

Coil 27B in FIG. 10 is similar to coil 27A of FIG. 7 except that the tab leads 46 and 48 of coil 27B extend from the same ends of the coil.

Figure 11:
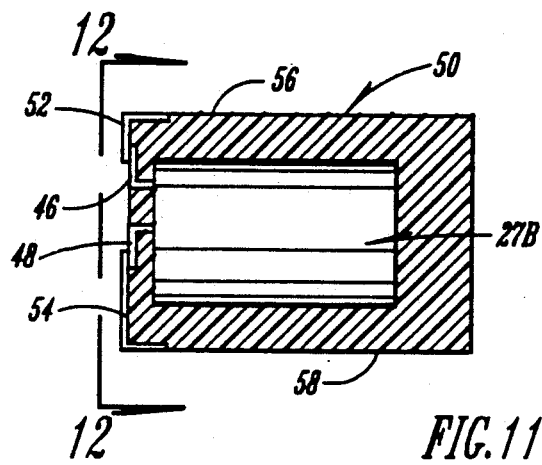
FIG. 11 is a view similar to that of FIG. 8 but shows the device of FIG. 10 embedded and assembled with surface mounting leads.
Figure 12:
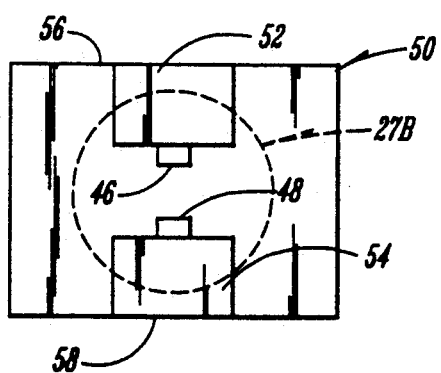
FIG. 12 is an elevational view of the device of FIG. 11 taken on line 12—12 of FIG. 11.

FIGS. 11 and 12 show coil 27B encapsulated in an insulative body 50 similar to body 38. The material 50 is the same material as that of material 28 and 38. L-shaped surface mount lead 52 is welded or otherwise secured to tab 46 which is bent upwardly. Similarly, an L-shaped surface mount lead 54 is secured to the downside bent end of lead 48. As shown in FIGS. 11 and 12, the upper and lower portions of leads 52 and 54, respectively, are flush with the top 56 and the bottom 58 of body member 50 so as to permit these respective leads to maintain electrical contact with surfaces adjacent thereto.

Figure 13:
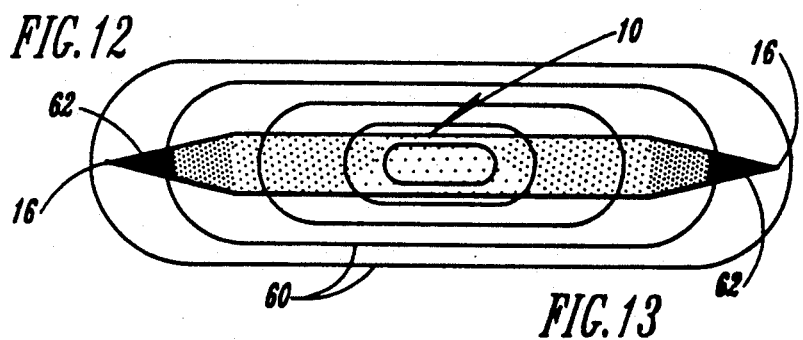
FIG. 13 is a plan view of the band resistive element of this invention showing flux lines created when current is forced to flow to the resistive element.

With reference to FIG. 13, flux lines 60 are shown dispersed around the magnetic band 10 as current is passed therethrough. The dotted shading 62 designates the current density under those conditions being concentrated adjacent the tapered sharp side edges 16 of the band. FIG. 13 shows the skin effect in the rectangular cross section of band 10. When a high voltage transient occurs, skin effect causes current to be redistributed over the cross section of the band 10. The current is forced to flow in areas of band 10 where it is encircled by the smallest number of flux lines 10. Since current only flows through a small portion of band 10, its resistance is significantly increased. It is this increase in resistance that dissipates as heat the energy contained in a high voltage transient.

From the foregoing, it is seen that this device will achieve at least all of its stated objectives.

I claim:

1. A magnetic variable resistor, comprising,
   an elongated band of electrically resistive material, and having opposite ends, tapered side edges, and opposite planar surfaces,
   an insulative sheet secured to and coextensive with one of said planar surfaces,
   electrical leads secured to opposite ends of said band and extending outwardly therefrom away from the longitudinal axis of said band,
   said band and said insulative sheet being rolled to a helical coil, and
   said leads extending longitudinally from said coil.

2. A magnetic variable resistor, comprising,
   an elongated band of electrically resistive material, and having opposite ends, tapered side edges, and opposite planar surfaces,
   electrical leads secured to opposite ends of said band and extending outwardly therefrom away from the longitudinal axis of said band,
   said band being rolled to a helical coil,
   said helical coil having spaced convolutions with insulative material therebetween, and
   said leads extending longitudinally from said coil.

3. A magnetic variable resistor, comprising,
   an elongated band of electrically resistive material, and having opposite ends, side edges and opposite planar surfaces,
   electrical leads secured to opposite ends of said band and extending outwardly therefrom away from the longitudinal axis of said band,
   said band being rolled into a helical coil, comprised of a plurality of spaced spiral segments, and insulative material encapsulating said helical coil and surrounding said spiral segments, with said leads extending outwardly through said insulative material; said insulative material containing magnetic material.

4. The magnetic variable resistor of claim 3 wherein side edges are tapered.

5. The resistor of claim 2 wherein said insulative material is a ferro magnetic material.

6. The resistor of claim 2 comprised of carbonyl iron powder mixed with an organic binder.

7. The device of claim 1 wherein said leads are connected to surface mount leads which are tangentially positioned with respect to said helical coil.

8. A magnetic variable resistor, comprising,
   an elongated band of electrically resistive material, and having opposite ends, tapered side edges and opposite planar surfaces,
   electrical lead secured to opposite ends of said band and extending outwardly therefrom away from the longitudinal axis of said band, said band being rolled into a helical coil, and insulative material encapsulating said helical coil, with said leads extending outwardly through said insulative material; said insulative material containing magnetic material.

9. A magnetic variable resistor, comprising, an elongated band of electrically resistive material, and having opposite ends, side edges and opposite planar surfaces, electrical leads secured to opposite ends of said band and extending outwardly therefrom away from the longitudinal axis of said band, said band being rolled into a helical coil, and insulative material encapsulating said helical coil, with said leads extending outwardly through said insulative material; said insulative material containing magnetic material and being comprissed of carbonyl iron powder mixed with an organic binder.

* * * * *

UNITED STATES PATENT AND TRADEMARK OFFICE
CERTIFICATE OF CORRECTION

PATENT NO. : 5,235,311
DATED : August 10, 1993
INVENTOR(S) : Herman R. Person and Thomas L. Veik It is certified that error appears in the above-indentified patent and that said Letters Patent is hereby corrected as shown below:

In column 5, lines 7-10 should read:

9. A magnetic variable resistor, comprising,
an elongated band of electrically resistive material,
       and having opposite ends, tapered side edges and
       opposite planar surfaces, Signed and Sealed this Twenty-seventh Day of September, 1994

Attest:

BRUCE LEHMAN

Attesting Officer     Commissioner of Patents and Trademarks